(12) United States Patent
Zhu et al.

(10) Patent No.: US 8,981,454 B2
(45) Date of Patent: Mar. 17, 2015

(54) NON-VOLATILE MEMORY DEVICE USING FINFET AND METHOD FOR MANUFACTURING THE SAME

(75) Inventors: Huilong Zhu, Poughkeepsie, NY (US);
Haizhou Yin, Poughkeepsie, NY (US);
Zhijiong Luo, Poughkeepsie, NY (US)

(73) Assignee: Institute of Microelectronics, Chinese Academy of Sciences (CN)

( * ) Notice: Subject to any disclaimer, the term of this patent is extended or adjusted under 35 U.S.C. 154(b) by 870 days.

(21) Appl. No.: 13/061,461

(22) PCT Filed: Sep. 25, 2010

(86) PCT No.: PCT/CN2010/001481
§ 371 (c)(1),
(2), (4) Date: Feb. 28, 2011

(87) PCT Pub. No.: WO2012/003612
PCT Pub. Date: Jan. 12, 2012

(65) Prior Publication Data
US 2012/0007166 A1    Jan. 12, 2012

(30) Foreign Application Priority Data
Jul. 7, 2010  (CN) .......................... 2010 1 0227256

(51) Int. Cl.
*H01L 29/788* (2006.01)
*H01L 29/66* (2006.01)
*H01L 29/78* (2006.01)

(52) U.S. Cl.
CPC ...... *H01L 29/66825* (2013.01); *H01L 29/7881* (2013.01); *H01L 29/785* (2013.01)
USPC ........... 257/316; 257/315; 257/319; 257/401; 257/619

(58) Field of Classification Search
CPC . H01L 27/1203; H01L 29/785; H01L 29/788; H01L 29/66795; H01L 27/10826; H01L 27/10879; H01L 27/1211
USPC .......... 257/314, 316, 319, 320, 401, 618, 619
See application file for complete search history.

(56) References Cited

U.S. PATENT DOCUMENTS

| | | | |
|---|---|---|---|
| 6,413,802 B1 | 7/2002 | Hu et al. | |
| 6,963,104 B2 | 11/2005 | Wu et al. | |

(Continued)

FOREIGN PATENT DOCUMENTS

| | | |
|---|---|---|
| CN | 1806334 A | 7/2006 |
| CN | 1988160 A | 6/2007 |
| CN | 101273441 A | 9/2008 |

OTHER PUBLICATIONS

"Chinese Application Serial No. 201010227256.8, Office Action mailed Feb. 18, 2013", (w/ English Translation), 7 pgs.

(Continued)

*Primary Examiner* — Matthew E Warren
(74) *Attorney, Agent, or Firm* — Schwegman Lundberg & Woessner, P.A.

(57) ABSTRACT

The present application discloses a non-volatile memory device, comprising a semiconductor fin on an insulating layer; a channel region at a central portion of the semiconductor fin; source/drain regions on both sides of the semiconductor fin; a floating gate arranged at a first side of the semiconductor fin and extending in a direction further away from the semiconductor fin; and a first control gate arranged on top of the floating gate or covering top and sidewall portions of the floating gate. The non-volatile memory device reduces a short channel effect, has an increased memory density, and is cost effective.

11 Claims, 12 Drawing Sheets

(56) References Cited

U.S. PATENT DOCUMENTS

| | | | |
|---|---|---|---|
| 7,087,952 B2 | 8/2006 | Zhu et al. | |
| 7,285,820 B2 * | 10/2007 | Park et al. | 257/316 |
| 7,371,638 B2 * | 5/2008 | Cho et al. | 438/257 |
| 7,791,128 B2 | 9/2010 | Doornbos et al. | |
| 7,842,995 B2 | 11/2010 | Park et al. | |
| 8,159,878 B2 * | 4/2012 | Widjaja | 365/185.14 |
| 8,325,530 B2 * | 12/2012 | Lue et al. | 365/185.18 |
| 2009/0108324 A1 | 4/2009 | Zhu et al. | |
| 2009/0250742 A1 * | 10/2009 | Kinoshita et al. | 257/319 |
| 2011/0079838 A1 * | 4/2011 | Lee et al. | 257/316 |

OTHER PUBLICATIONS

"International Application Serial No. PCT/CN2010/001481, International Preliminary Report on Patentability dated Jan. 8, 2013", (w/ English Translation), 10 pgs.

"International Application Serial No. PCT/CN2010/001481, International Search Report mailed Apr. 7, 2011", 3 pgs.

"International Application Serial No. PCT/CN2010/001481, Written Opinion mailed Apr. 7, 2011", (w/ English Translation), 8 pgs.

* cited by examiner

NON-VOLATILE MEMORY DEVICE USING FINFET AND METHOD FOR MANUFACTURING THE SAME

RELATED APPLICATIONS

This application is a nationalization under 35 U.S.C. 371 of PCT/CN2010/001481, filed Sep. 25, 2010 and published as WO/2012/003612 on Jan. 12, 2012, which claimed priority under 35 U.S.C. 119 to Chinese Patent Application Serial No. 201010227256.8, filed Jul. 7, 2010; which applications and publication are incorporated herein by reference in their entirety.

BACKGROUND OF THE INVENTION

1. Field of Invention

The present invention relates to a non-volatile memory device and a method for manufacturing the same, and more particularly, to a non-volatile memory device using FinFETs (Fin-type Field Effect Transistors) and a method for manufacturing the same.

2. Description of Prior Art

Non-volatile memory (NVM) may hold data information in a power off state and thus is widely used. A typical non-volatile memory comprises an MOSFET (Metal Oxide Semi-conductor Field Effect Transistor) having a floating gate, and may represent digit "0" or "1" by the amount of charges stored in the floating gate.

Typically, a non-volatile memory comprises cells arranged in an array to provide required memory capacity. For a certain area of a chip, the memory has larger capacity with the increase of the density of the memory. The memory capacity of a non-volatile memory depends on a novel device structure (having a reduced size of a memory cell) with respect to one aspect, and on improvement of microelectronic fabrication technique (which indicates the reduction of the minimum feature size that may be achieved in practice).

However, short channel effects may occur with the scaling of MOSFETs.

Cheming Hu et al. proposed an FinFET formed on an SOI (Silicon-On-Insulator) substrate in U.S. Pat. No. 6,413,802, which comprises a channel region provided in a central portion of a fin of semiconductive material, and source/drain regions provided on both sides of the fin. A gate electrode is provided at both sides of the channel region and surrounds it to provide, for example, a double-gate FinFET, in which inversion layers are created at both sides of the channel. The channel region in the fin has a small thickness so that the whole channel region is controlled by the gate, which suppresses the short channel effect.

The present inventor proposed an NVM using an FinFET in U.S. Pat. No. 7,087,952, which has a control gate at one side of a semiconductor fin and a floating gate at the other side of the semiconductor fin.

In such a floating-gate type memory device, charges tunnel through a floating gate dielectric layer from a substrate to a floating gate, and are then stored in the floating gate. The charges may bei hold even in a case that the memory device is in a power off state. The threshold voltage (Vth) of the FinFET is determined by the amount of charges, and logic "1" and "0" may be distinguished from each other.

Such a non-volatile memory alleviates the negative effect of the short channel effect on the threshold voltage by using an FinFET, and thus has an improved reliability and durability.

However, both the control gate and the floating gate of the non-volatile memory device are provided in Front-End-Of-Line (FEOL), which increases the complexity of the fabrication process and is less cost effective.

SUMMARY THE INVENTION

An object of the present invention is to provide a non-volatile memory device using an FinFET which is cost effective, and a method for manufacturing the same.

According to one aspect of the invention, there provides a non-volatile memory device, comprising a semiconductor fin on an insulating layer; a channel region at a central portion of the semiconductor fin; source/drain regions on both sides of the semiconductor fin; a floating gate arranged at a first side of the semiconductor fin and extending in a direction further away from the semiconductor fin; and a first control gate arranged on top of the floating gate or covering top and sidewall portions of the floating gate.

According to another aspect of the invention, there provides a method for manufacturing a non-volatile memory device, comprising:
a) forming a semiconductor fin on an insulating layer;
b) forming a floating gate on a first side of the semiconductor fin, the floating gate extending in a direction further away form the semiconductor fin;
c) forming source/drain region on both sides of the semiconductor fin; and
d) forming a first control gate on top of the floating gate or on top and sidewall portions of the floating gate.

The inventive non-volatile memory device suppresses a short channel effect by using an FinFET, which in turn increases a memory density. Moreover, the floating gate is formed in FEOL in the same manner as a normal gate of the FinFET, and the control gate is then formed in Back-End-Of-Line (BEOL) in a manner compatible with normal vias and interconnect.

No additional mask, deposition of material or lithography step is introduced in the FEOL. Only the BEOL is modified by adding the steps of deposition and planarization of an interlayer dielectric layer. Consequently, the complexity of process for forming the non-volatile memory device is reduced greatly, and manufacturing cost is then reduced.

Moreover, according to a preferable embodiment of the present invention, there provides a dual-function FET in which a normal gate of the FinFET is formed at one side of the fin, and a floating gate and a control gate of the non-volatile memory device are formed at the other side of the fin. The actual function of the semiconductor device can be determined by changing external wirings.

DETAILED DESCRIPTION OF PREFERRED EMBODIMENTS

Figure 1:
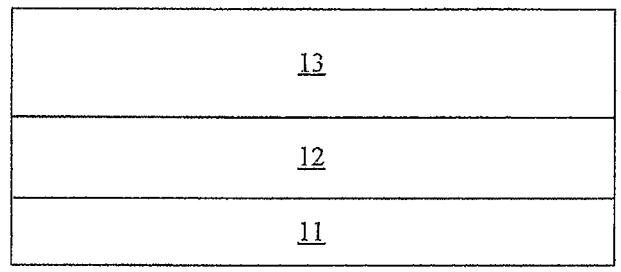
FIGS. 1 to 9, 10A, 10B, 11, 12, 13A to 13C, 14A, 14B, 15A and 15B show schematic views of the semiconductor structures at various stages of the method for manufacturing a non-volatile memory device according to a first embodiment of the present invention.

Exemplary embodiments of the present invention are described in more detail below with reference to the accompanying drawings. In the drawings, like reference numerals denote like members. The figures are not drawn to scale for the sake of clarity.

For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

In the present application, the term "semiconductor structure" generally means the whole semiconductor structure formed at each step of the method for manufacturing the semiconductor device, including all of the layers and regions having been formed.

Some particular details of the invention will be described, such as an exemplary structure, material, dimension, process and fabricating method of the device, for a better understanding of the present invention. Nevertheless, it is understood by one skilled person in the art that these details are not always essential, but can be varied in a specific implementation of the invention Unless the context clearly indicates otherwise, each part of the non-volatile memory device can be made of material(s) well-known to one skilled person in the art. The semiconductor material comprises, for example, group III-V semiconductors, such as GaAs, InP, GaN, and SiC, and group IV semiconductors, such as Si, and Ge. A gate conductor may be made of an conductive material, such as a metal layer, a doped polysilicon layer, a gate stack conductor including a metal layer and a doped polysilicon layer, or other conductive materials. The conductive materials for the gate conductor layer may be at least one selected from a group comprising TaC, TIN, TaTbN, TaErN, TaYbN, TaSiN, HfSiN, MoSiN, RuTa$_x$, NiTa$_x$, MoN$_x$, TiSiN, TiCN, TaAlC, TiAlN, TaN, PtSi$_x$, Ni$_3$Si, Pt, Ru, Ir, Mo, HfRu, and RuO$_x$, or any combination theirof. A gate dielectric layer is made of SiO$_2$ or other dielectric insulation material which has a dielectric constant larger than that of SiO$_2$, such as oxide, nitride, oxynitride, silicate, aluminate, and titanate. The oxide may comprise, for example, SiO$_2$, HfO$_2$, ZrO$_2$, Al$_2$O$_3$, TiO$_2$, and La$_2$O$_3$. The nitride may comprise, for example, Si$_3$N$_4$. The silicate may comprise, for example, HfSiO$_x$. The aluminate may comprise, for example, LaAlO$_3$. The titanate may comprise, for example, SrTiO$_3$. The oxynitride may comprise, for example, SiON. Moreover, the gate dielectric layer can be made of materials to be developed in the future, besides the materials known by one skilled person in the art.

Figure 8:
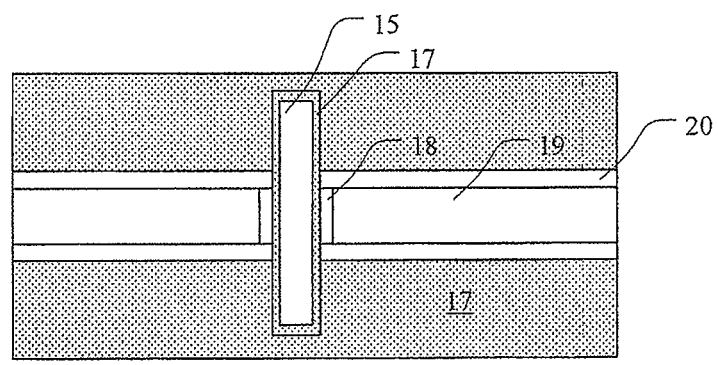
Figure 9:
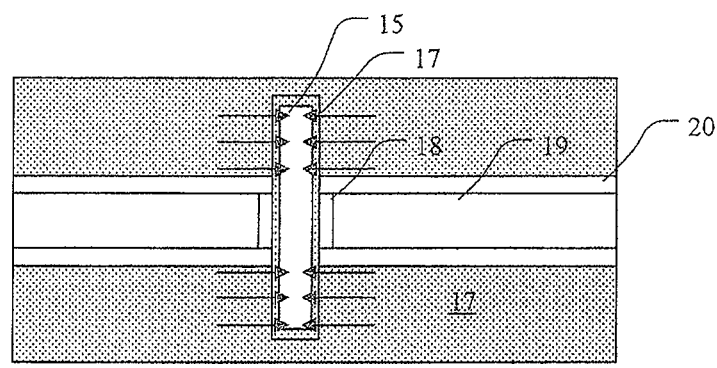
Figure 10A:
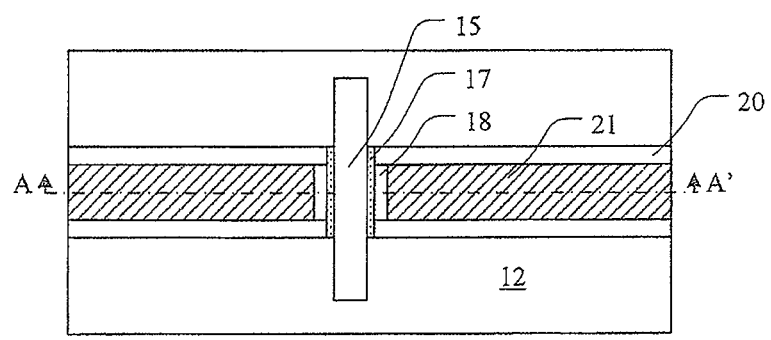
Figure 10B:
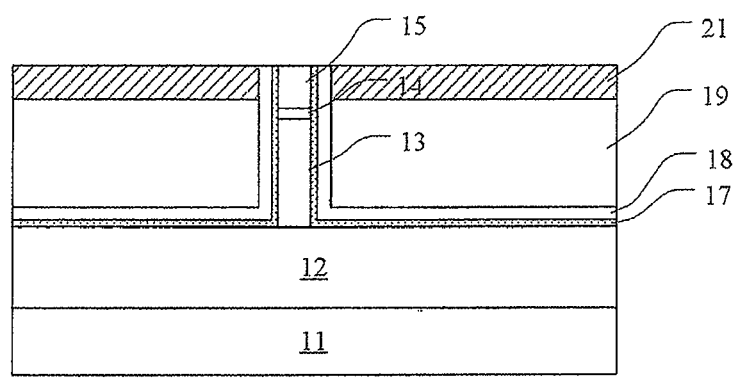
Figure 11:
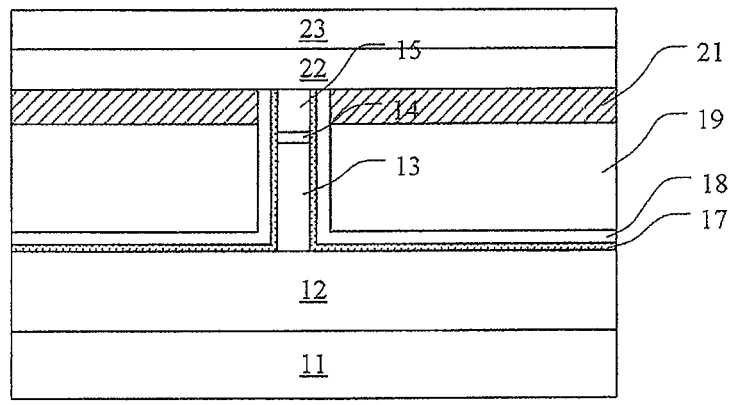

According to one preferable embodiment of the present invention, the steps in the FEOL shown in FIGS. 1-11 are performed in sequence, in which FIGS. 1-5 shows cross sectional views of the semiconductor structure, FIGS. 6-9 and 10 shows top views of the semiconductor structure, and FIGS. 10B and 11 show cross sectional views of the semiconductor structure.

As shows in FIG. 1, the method according to the present invention is performed based on an SOI wafer. The SOI wafer comprises a bottom substrate 11, a Buried Oxide (BOX) layer 12 and a top semiconductor layer 13.

Figure 2:
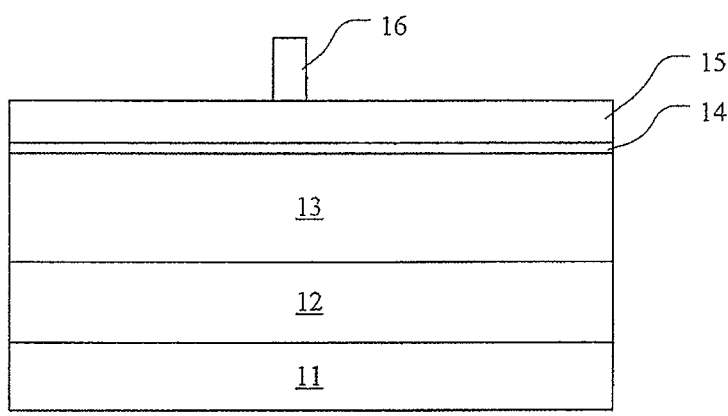

A thin oxide layer 14 and a nitride layer 15 are then formed in sequence on the semiconductor layer 13 by a conventional deposition process, such as Chemical Vapor Deposition (CVD), Atomic Layer Deposition (ALD), sputtering, and the like. Then a photoresist layer 16 is formed on the nitride layer 15 by spin coating, and then the photoresist layer 16 is patterned into a stripe by a lithography process including exposure and development, as shown in FIG. 2.

Figure 3:
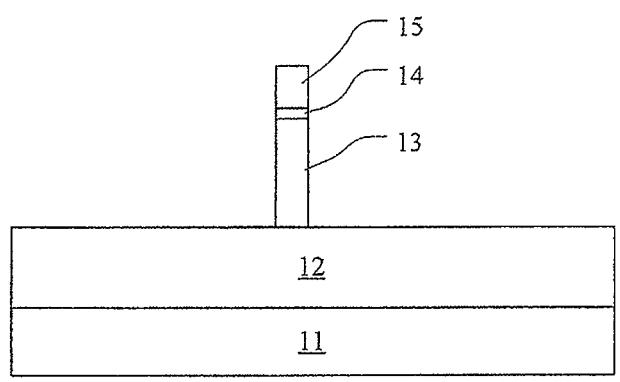

With the patterned photoresist layer 16 as a mask, the exposed portions of the nitride layer 15, the thin oxide layer 14, and the top semiconductor layer 13 are then removed in sequence from top to bottom by a dry etching process, such as ion beam milling, plasma etching, reactive ion etching, and laser ablation, or by a wet etching process in which a solution of etchant is used, so that a fin is formed by the remaining portion of the top semiconductor layer 13, as shown in FIG. 3. The photoresist layer 16 is then removed by ashing or dissolving in solvent. The etching stops at the top of the BOX layer 12. FIG. 3 shows the width of the fin in the horizontal direction, and the height of the fin in the vertical direction. However, the length of the fin, extending in the direction perpendicular to the paper surface, is not shown in FIG. 3.

Figure 4:
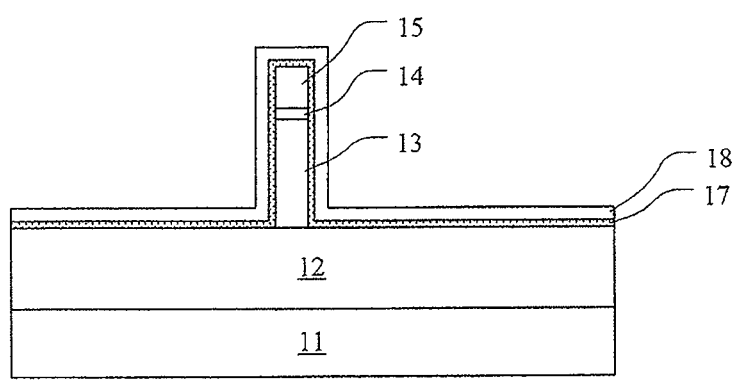

A conformal floating gate dielectric layer 17 and a conductive nitride layer 18 are formed in sequence on the surface of the whole semiconductor structure by the above conventional deposition process, as shown in FIG. 4. The floating gate dielectric layer 17 comprises, for example, a HfO$_2$ layer having a thickness of about 2-40 nm, or a SiO$_2$ layer having a thickness of about 1-20 nm. The conductive nitride layer 18 is, for example, a TiN layer having a thickness of about 5-20 nm. As well known to one skilled person in the art, the gate stack including at least a conductive nitride layer 18, such as a HfO$_2$/TiN gate stack, may advantageously achieve a reduced gate leakage current. It should be noted that the conductive nitride layer 18 also serves as a barrier layer. However, the barrier layer may also be made of other conductive materials, such as TaN, TiN, Ta, Ti, TiSiN, TaSiN, TiW, WN, Ru, and the like. The present invention is not limited hereto.

Figure 5:
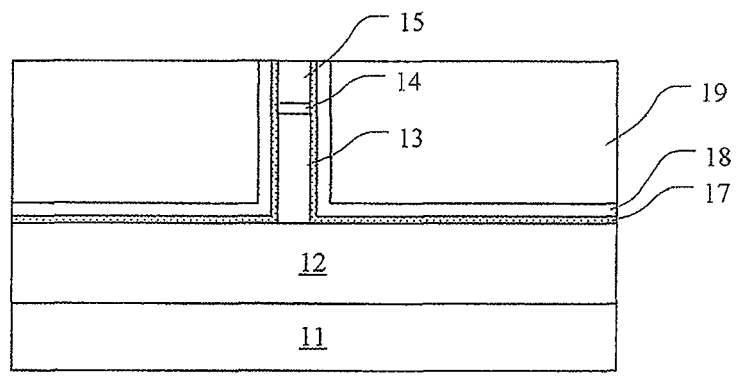

A polysilicon layer 19 is then formed to cover the surface of the whole semiconductor structure by the above conventional deposition process, as shown in FIG. 5, followed by a Chemical Mechanical Planarization (CMP) process performed thereon. The CMP stops on top of the nitride layer 15, so that the portions of the floating gate dielectric layer 17 and the conductive nitride layer 18 above the nitride layer 15 are removed. Doping or in-situ doping may be performed on the polysilicon layer 19 in a separate step to make it conductive. The polysilicon layer may also be made of other conductive materials used for a gate, such as, TiAl, Al, Co, Ni, Cu, W, metal alloy, and the like, for example, the various conductive materials used for gates as mentioned above. The present invention is not limited hereto.

The conductive nitride layer 18 serves as a barrier layer sandwiched between the floating gate dielectric layer 17 and the polysilicon layer 19, and is a portion of the gate conductor for tuning a work function of the semiconductor device.

The polysilicon layer 19 and the conductive nitride layer 18 are then patterned into a stripe extending in a direction substantially perpendicular to the direction along which the fin extends. In the patterning step, a photoresist mask (not shown) is used in the above dry etching or wet etching process. The etching stops at the top of the floating gate dielectric layer 17.

The stack of the semiconductor layer 13, the thin oxide layer 14 and the nitride layer 15 are surrounded by the floating gate dielectric layer 17. The portion of the conductive nitride layer 18 exposed from the photoresist mask is also removed and the underlying floating gate dielectric layer 17 is exposed.

Figure 6:
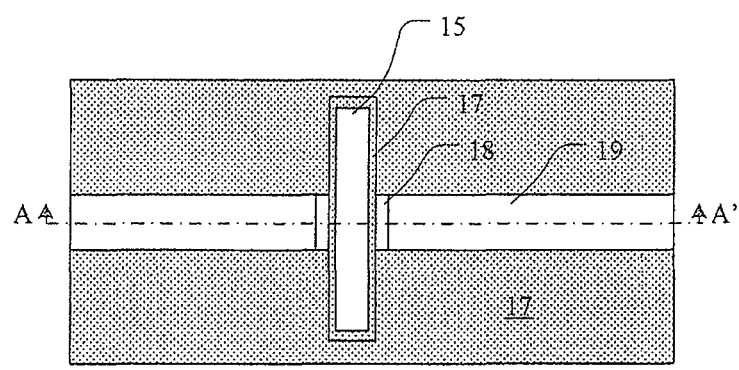

The cross sectional views shown in FIGS. 1-5 are taken along line A-A' indicated in the top view shown in FIG. 6.

Figure 7:
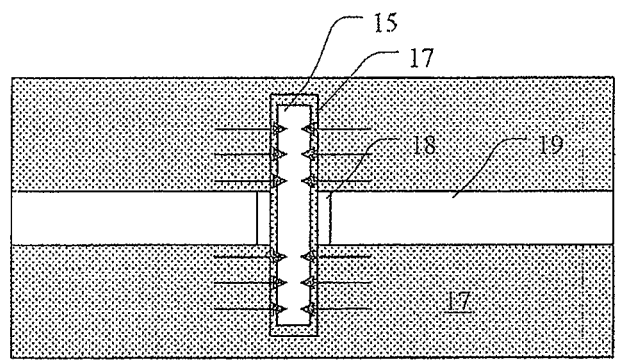

An extension implantation and/or a halo implantation are performed on portions of the top semiconductor layer 13 on both sides of the fin formed from by a conventional process, as shown in FIG. 7. The arrow in the figure indicates the fact that the extension implantation and/or halo implantation are performed at both sides of the fin.

A nitride sidewall spacer 20 is formed at both sides of the polysilicon layer 19 and the conductive nitride layer 18 by firstly forming a nitride layer having a thickness of about 10-30 nm on the surface of the whole semiconductor structure by the above conventional deposition process, and then removing a portion of the nitride layer by the above dry etching or wet etching through a photoresist mask, as shown in FIG. 8.

A source/drain implantation is then performed on portions of the semiconductor layer on both sides of the fin by a conventional process, followed by a spike annealing at about 1000-1080° C. to activate the implanted ions in the previous implantation process and eliminate damages caused by the implantation process, to provide a source region and a drain region (not shown), as shown in FIG. 9.

Because the source/drain implantation is performed after formation of the nitride sidewall spacer 20, the source region and the drain region are further away form the channel region at the central portion of the fin than the extension region.

The portions of the floating gate dielectric layer 17 at both sides of the source/drain regions are then removed by the above dry etching or wet etching, and the surfaces of the portions of the top semiconductor layer 13 below the nitride layer 15 and the thin oxide layer 14 are partially silicided to convert the surface layer of the source/drain regions to a metal nitride layer 21 (not shown). The surface layer of the polysilicon layer 19 in the gate region is also converted to a metal silicide layer 21 shown in FIG. 10B by the same silicidation process, as shown in FIGS. 10A and 10B.

According to a preferred embodiment of the method for the present invention, the steps shown in FIGS. 12-15 are performed in sequence in the BEOL.

A nitride layer 22 and an oxide layer 23 are then formed to cover the surface of the whole semiconductor structure by the above conventional deposition process, followed by a Chemical Mechanical Planarization (CMP) process performed thereon to provide a flat surface of the oxide layer 23, as shown in FIG. 11.

Figure 12:
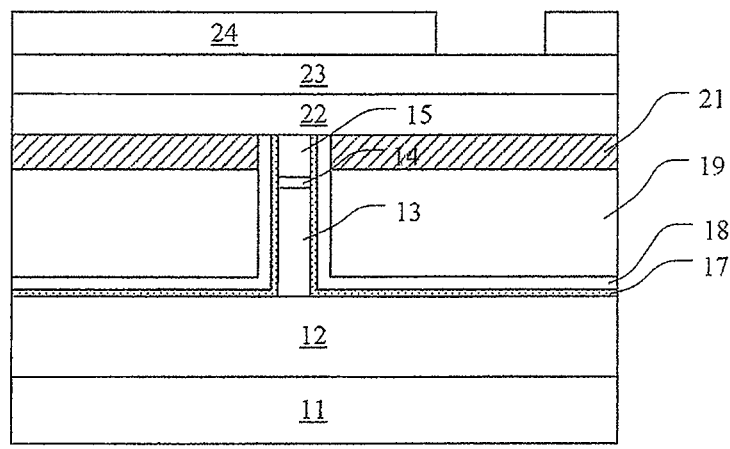

A photoresist layer 24 is then formed on the surface of the whole semiconductor structure, for example, by spin coating, and an opening is formed in the photoresist layer 24 by a lithography process including exposure and development, as shown in FIG. 12. The opening is located above the polysilicon layer 19.

Figure 13A:
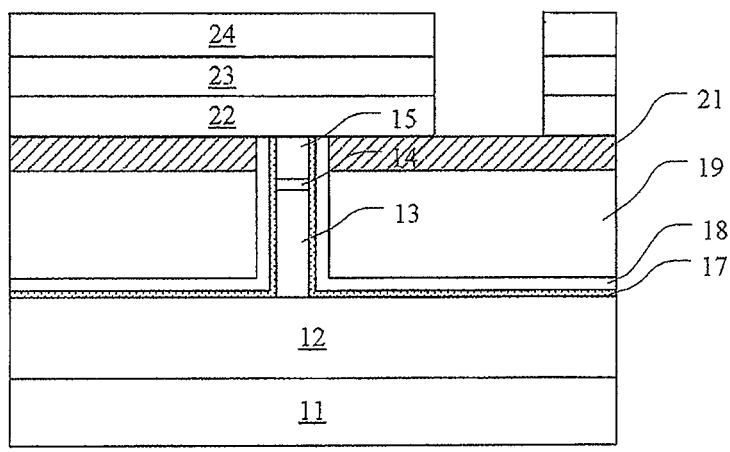
Figure 13B:
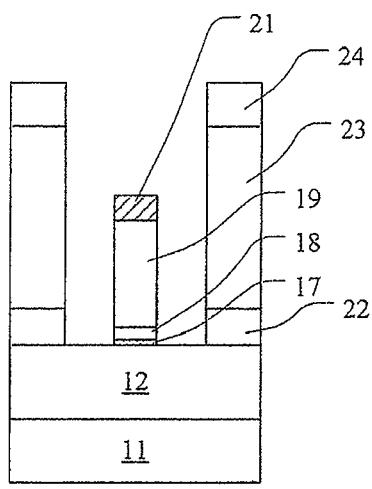

With the photoresist layer 24 having an opening therein as a mask, the portions of the oxide layer 23 and the nitride layer 22 exposed from the opening are removed in sequence from top to bottom by the above dry etching or wet etching which stops at the top of the silicide layer 21, as shown in FIGS. 13A and 13B.

Further, the etching process selectively removes the portions of the oxide layer 23 and the nitride layer 22 exposed from the opening, at both sides of the floating gate in a stripe shape, which stops at the top of the BOX layer 12, as shown in FIG. 13B.

Consequently, the etching process exposes the top and sidewall portions of the floating gate. The floating gate comprises the polysilicon layer 19, the conductive nitride layer 18 and the floating gate dielectric layer 17 from top to bottom.

Figure 13C:
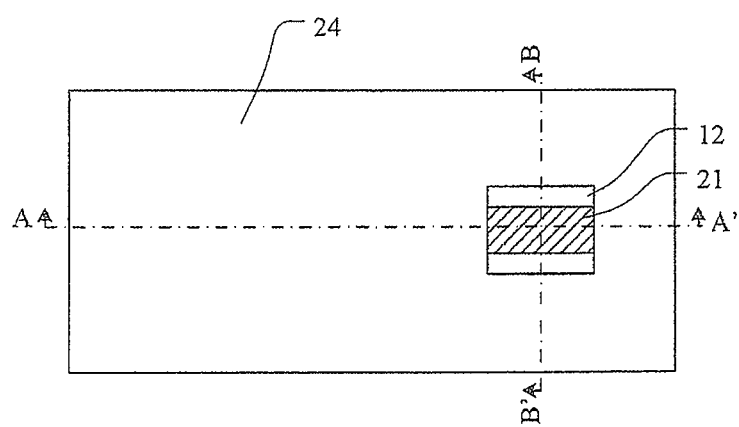

FIG. 13C is a top view of the resulting semiconductor structure, and FIG. 13A is taken along line A-A' and FIG. 13B is taken along line B-B' indicated in FIG. 13C.

Figure 14A:
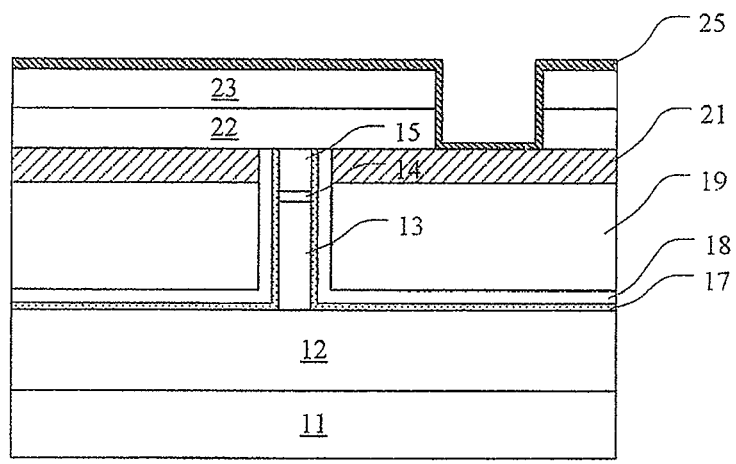
Figure 14B:
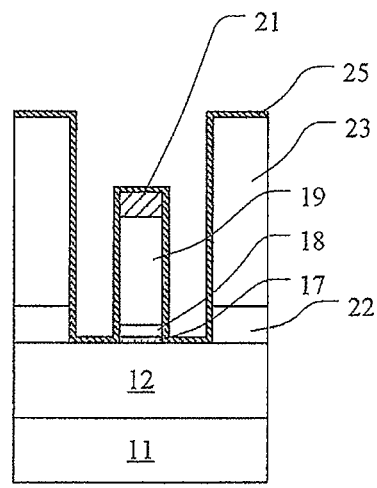

The photoresist layer 24 is then removed by ashing or dissolution in a solvent, and a conformal intermediate dielectric layer 25, for example, $Al_2O_3$ or $HfO_2$, is formed on the surface of the whole semiconductor structure by a conventional process, as shown in FIGS. 14A and 14B.

The intermediate dielectric layer 25 insulates a control gate conductor to be formed from the underlying floating gate conductor (i.e. the polysilicon layer 19 in the gate region).

Figure 15A:
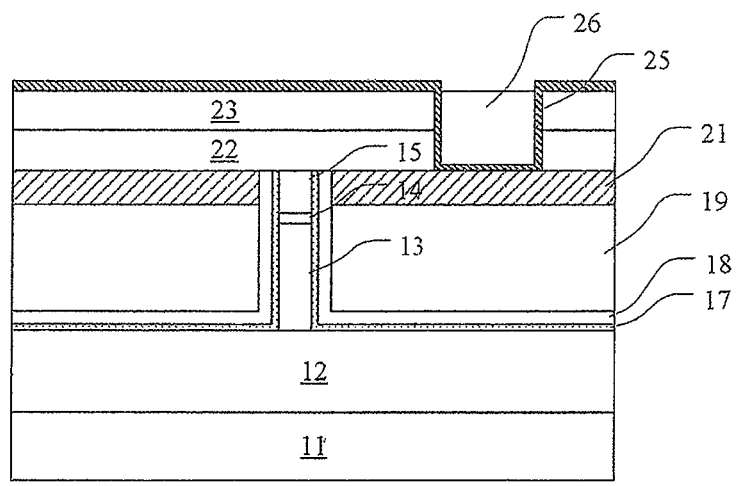
Figure 15B:
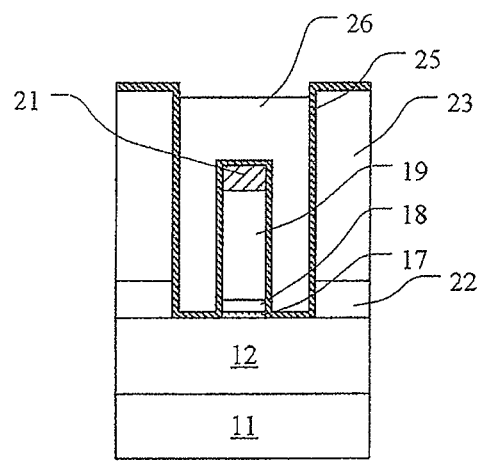

A conductive layer, for example of W, is formed to cover the surface of the whole semiconductor structure by a conventional process, and then etched back to leave a conductive filler 26 only in the opening in the nitride layer 22 and the oxide layer 23, as shown in FIGS. 15A and 15B. The conductive filler 26 serves as a control gate conductor. As a result of the etching back process, the portions of the intermediate dielectric layer 25 outside the opening are kept. Alternatively, only the portions of the intermediate dielectric layer 25 at the inner walls of the opening in the nitride layer 22 and the oxide layer 23 may be kept.

The control gate comprises the conductive filler 26 and the intermediate dielectric layer 25 which cover the top and sidewall portions of the floating gate in a stripe shape, as shown in FIG. 15B.

Optionally, the control gate conductor may be a stack of a barrier layer (not shown, for example, a TiN layer having a thickness of about 3-12 nm) and the conductive filler 26, which may advantageously achieve a reduced gate leakage current as mentioned above.

The other portions of the non-volatile memory device are then formed based on the resulting semiconductor structure, by the subsequent steps of forming an interlayer dielectric layer, forming through holes in the interlayer dielectric layer, forming wires and electrodes on the top surface of the interlayer dielectric layer, and the like. These subsequent steps are well known to one skilled person in the art.

The non-volatile memory device according to the first embodiment of the present invention is shown in FIGS. 15A and 15B, comprising: a fin formed from the top semiconductor layer 13 of the SOI wafer; source/drain regions (not shown) formed on both sides of the fin; a floating gate formed at one side of the fin and extending along the direction further away from the semiconductor fin, wherein the floating gate comprises the floating gate dielectric layer 17 and the floating gate conductor, the floating gate conductor being a stack of the conductive nitride 18 and the polysilicon layer 19; and a control gate covering the top and sidewall portions of the floating gate, wherein the control gate comprises a control gate conductor consisting of the intermediate dielectric layer 25 and the conductive filler.

Figure 16A:
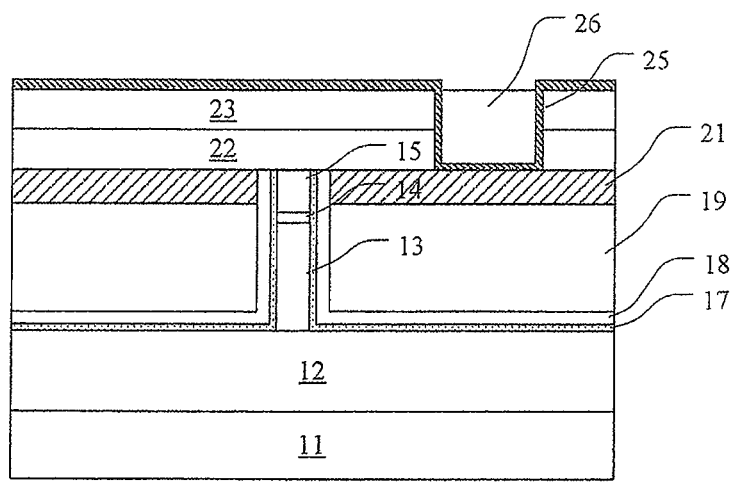
FIGS. 16A and 16B shows schematic views of the non-volatile memory device according to a second embodiment of the present invention.
Figure 16B:
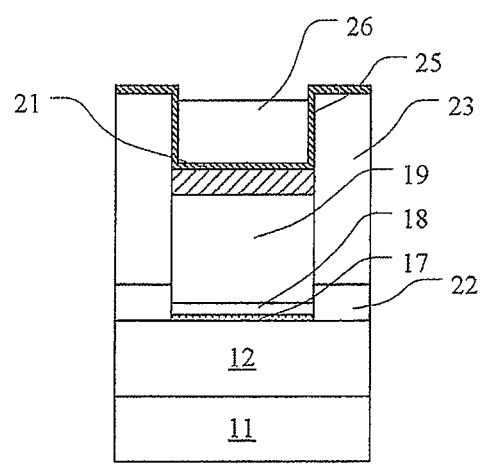

The non-volatile memory device according to the second embodiment of the present invention is shown in FIGS. 16A and 16B, comprising: a fin formed from the top semiconductor layer 13 on the SOI wafer; source/drain regions (not shown) formed on both sides of the fin; a floating gate formed at one side of the fin and extending in a direction further away from the semiconductor fin, wherein the floating gate comprises the floating gate dielectric layer 17 and the floating gate conductor, the floating gate conductor being a stack of the conductive nitride 18 and the polysilicon layer 19; and a control gate on top of the floating gate, wherein the control gate comprises a control gate conductor consisting of the intermediate dielectric layer 25 and the conductive filler 26.

The non-volatile memory device in the second embodiment differs from that in the first embodiment in that the control gate in the second embodiment is located only on top of the floating gate.

Figure 17:
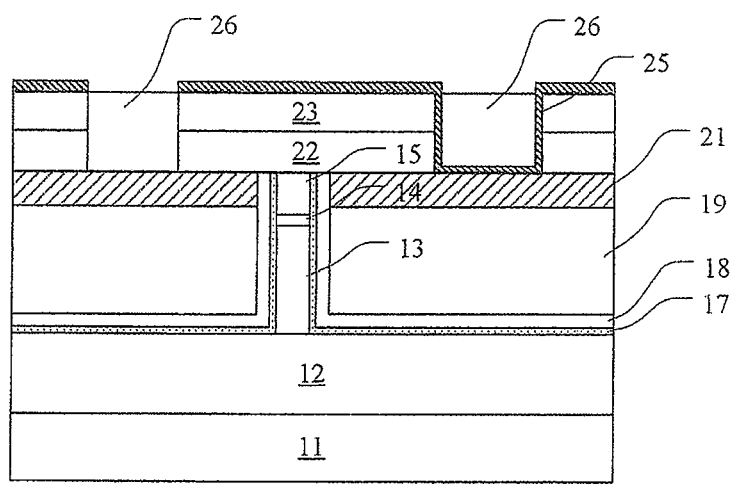
FIG. 17 shows a schematic view of the dual-function FET according to the present invention.

As a variation of the above non-volatile memory device, a dual-function transistor is also proposed. As shown in FIG. 17, the dual-function transistor comprises: a semiconductor fin formed from the semiconductor layer 13 on the SOI wafer; source/drain regions (not shown) formed on both sides of the fin; a floating gate formed at one side (referred as "first side" hereinafter) of the fin and extending in a direction further away from the semiconductor fin, wherein the floating gate comprises the floating gate dielectric layer 17 and the floating gate conductor, the floating gate conductor being a stack of the conductive nitride 18 and the polysilicon layer 19; a first control gate being located on the top or covering the top and sidewall portions of the floating gate, wherein the first control gate comprises a first control gate conductor consisting of the intermediate dielectric layer 25 on the floating gate conductor and the conductive filler 26; and a second control gate formed at the other side (referred as "second side" hereinafter, the second side being opposite to the first side) of the semiconductor fin and extending in a direction further away from the semiconductor fin, wherein the second control gate comprises the floating gate dielectric layer 17 and a second control gate conductor consisting of a stack of the conductive nitride 18 and the polysilicon layer 19.

Preferably, the floating gate and the second control gate, which are arranged at the first side and second side of the fin, respectively, are made of the same dielectric material and conductive material, and are formed simultaneously in the same process.

The conductive filler 26 in contact with the second gate conductor is formed in the opening at the second side of the semiconductor fin above the second control gate, to provide conductive contact for connecting with a wire.

Preferably, the conductive contact at the second side of the semiconductor fin, and the first control gate conductor of the first control gate at the first side of the semiconductor fin are made of the same conductive material, and formed simultaneously in the same process.

In the resulting dual-function transistor, the dual-function transistor can be selectively used as a non-volatile memory device or a normal FinFET, by connecting the wire either to the first control gate at the first side of the semiconductor fin, or to the second control gate at the second gate at the second side of the semiconductor fin.

To provide the dual-function transistor shown in FIG. 17, the steps shown in FIGS. 1-14 are performed in sequence.

Based on the structure shown in FIGS. 14A and 14B, a photoresist layer having another opening at the second side of the semiconductor fin (i.e. the left side in the figure) is formed above the polysilicon layer 19 in an additional mask process. The portions of the intermediate dielectric layer 25, the oxide layer 23 and the nitride layer 22 exposed from the opening are removed in an additional etching process. Alternatively, the openings at the first side and the second side may be formed simultaneously.

Next, the step shown in FIGS. 15A and 15B are performed so that the conductive filler 26 is simultaneously filled into the openings at the first side (i.e. the right side in the figure) and the second side of the semiconductor fin to provide a first control gate covering the top and sidewall portions of the floating gate at the first side of the semiconductor fin, and to form conductive contact on the top and sidewall portions of the conventional gate of the FinFET at the second side of the semiconductor fin.

The other portions of the dual-function transistor are then formed based on the resulting semiconductor structure, by the subsequent steps of forming an interlayer dielectric layer, forming through holes in the interlayer dielectric layer, forming wires and electrodes on the top surface of the interlayer dielectric layer, and the like. These subsequent steps are well known to one skilled person in the art.

It should be noted that in the above embodiments of the non-volatile memory device and the dual-function transistor, each of the floating gate, the first control gate and the second control gate may comprise a gate conductor formed of a stack of a barrier layer and a conductive layer. As mentioned above, the barrier layer may be made of a conductive nitride and other materials for the barrier layer, and the conductive layer may be made of a polysilicon layer and other gate conductive materials.

The description mentioned above is only for the purpose of illustration and explanation, rather than enumerating and limiting the present invention. The invention is not limited to the embodiments described above. Various modifications and alternations may occur to those skilled in the art without departing from the true spirit and scope of the invention as defined by the appended claims.

What is claimed is:

1. A non-volatile memory device, comprising:
An insulating layer;
a semiconductor fin on the insulating layer, the semiconductor fin having a central portion and two opposing sides, a first side and a second side;
a channel region at the central portion of the semiconductor fin;
source/drain regions on both sides of the semiconductor fin;
a floating gate having a top and sidewall portions arranged at the first side of the semiconductor fin and extending in a direction further away from the semiconductor fin;
a first control gate arranged on top of the floating gate or covering top and sidewall portions of the floating gate; and
a second control gate arranged at a second side opposite to the first side of the semiconductor fin and extending in a direction further away from the semiconductor fin.

2. The non-volatile memory device according to claim 1, wherein the semiconductor fin is a silicon fin.

3. The non-volatile memory device according to claim 1, wherein the floating gate comprises a floating gate dielectric layer and a floating gate conductor, and the floating gate conductor is insulated from the semiconductor fin by the floating gate dielectric layer.

4. The non-volatile memory device according to claim 3, wherein the floating gate conductor is a stack of a barrier layer and an floating gate conductive layer, and the barrier layer is sandwiched between the floating gate conductive layer and the floating gate dielectric layer.

5. The non-volatile memory device according to claim 1, wherein the first control gate comprises an intermediate dielectric layer and a first control gate conductor.

6. The non-volatile memory device according to claim 5, wherein the first control gate conductor is made of at least one selected from a group comprising metals, doped polysilicon, and conductive nitride.

7. The non-volatile memory device according to claim 6, wherein the first control gate conductor is a stack of a barrier layer and an control gate conductive layer, and the barrier layer is sandwiched between the control gate conductive layer and the intermediate dielectric layer.

8. The non-volatile memory device according to claim 1, wherein the insulating layer is a buried insulating layer of an SOI wafer.

9. The non-volatile memory device according to claim 8, wherein the semiconductor fin is formed by a top semiconductor layer of the SOI wafer.

10. The non-volatile memory device according to claim 1, wherein the second control gate and the floating gate are made of the same dielectric material and conductive material.

11. The non-volatile memory device according to claim 2, further comprising:
   a second control gate arranged at a second side opposite to the first side of the semiconductor fin and extending in a direction further away from the semiconductor fin.

* * * * *